(12) United States Patent
Lasher et al.

(10) Patent No.: US 8,356,264 B2
(45) Date of Patent: Jan. 15, 2013

(54) IMPLEMENTING ENHANCED CLOCK TREE DISTRIBUTIONS TO DECOUPLE ACROSS N-LEVEL HIERARCHICAL ENTITIES

(75) Inventors: Mark R. Lasher, Colchester, VT (US); Daniel R. Menard, Arlington, MA (US); Phillip P. Normand, Chippewa Falls, WI (US)

(73) Assignee: International Business Machines Corporation, Armonk, NY (US)

( * ) Notice: Subject to any disclaimer, the term of this patent is extended or adjusted under 35 U.S.C. 154(b) by 139 days.

(21) Appl. No.: 12/914,573

(22) Filed: Oct. 28, 2010

(65) Prior Publication Data

US 2012/0110533 A1    May 3, 2012

(51) Int. Cl.
*G06F 17/50* (2006.01)

(52) U.S. Cl. ........ 716/113; 716/108; 716/122; 716/123; 716/124; 716/131; 703/16

(58) Field of Classification Search .................. 716/113, 716/108, 122, 123, 124, 129, 130, 131; 703/16
See application file for complete search history.

(56) References Cited

U.S. PATENT DOCUMENTS

| | | | |
|---|---|---|---|
| 5,686,845 A | 11/1997 | Erdal et al. | |
| 5,974,245 A * | 10/1999 | Li et al. | 716/55 |
| 6,204,713 B1 | 3/2001 | Adams et al. | |
| 6,651,232 B1 * | 11/2003 | Pileggi et al. | 716/114 |
| 6,751,786 B2 * | 6/2004 | Teng et al. | 716/114 |
| 7,243,323 B2 * | 7/2007 | Williams et al. | 716/113 |
| 7,257,788 B2 * | 8/2007 | Haar et al. | 716/113 |
| 7,392,495 B1 | 6/2008 | Cherukupalli et al. | |
| 7,562,316 B2 * | 7/2009 | Tschanz et al. | 716/120 |
| 7,779,372 B2 * | 8/2010 | Campbell et al. | 716/114 |
| 8,117,579 B2 * | 2/2012 | Warnock et al. | 716/113 |
| 8,205,182 B1 * | 6/2012 | Zlatanovici et al. | 716/125 |
| 8,214,790 B2 * | 7/2012 | Masleid et al. | 716/139 |
| 2003/0051222 A1 * | 3/2003 | Williams et al. | 716/12 |
| 2003/0208736 A1 * | 11/2003 | Teng et al. | 716/7 |
| 2004/0237060 A1 * | 11/2004 | Igarashi et al. | 716/12 |
| 2005/0102642 A1 * | 5/2005 | Tschanz et al. | 716/6 |
| 2007/0220468 A1 * | 9/2007 | Haar et al. | 716/6 |
| 2010/0031214 A1 * | 2/2010 | Hou et al. | 716/9 |
| 2010/0229142 A1 * | 9/2010 | Masleid et al. | 716/10 |
| 2012/0079437 A1 * | 3/2012 | Li et al. | 716/102 |

* cited by examiner

*Primary Examiner* — Phallaka Kik
(74) *Attorney, Agent, or Firm* — Joan Pennington

(57) ABSTRACT

A method, system and computer program product for implementing enhanced clock tree distributions to decouple across N-level hierarchical entities of an integrated circuit chip. Local clock tree distributions are constructed. Top clock tree distributions are constructed. Then constructing and routing a top clock tree is provided. The local clock tree distributions and the top clock tree distributions are independently constructed, each using an equivalent local clock distribution of high performance buffers to balance the clock block regions.

20 Claims, 6 Drawing Sheets

IMPLEMENTING ENHANCED CLOCK TREE DISTRIBUTIONS TO DECOUPLE ACROSS N-LEVEL HIERARCHICAL ENTITIES

FIELD OF THE INVENTION

The present invention relates generally to the data processing field, and more particularly, relates to a method, system and computer program product for implementing enhanced clock tree distributions to decouple across N-level hierarchical entities of an integrated circuit chip.

DESCRIPTION OF THE RELATED ART

High-frequency clock distributions require low skew. Common methods of constructing clock distributions can achieve low skew, but with extensive interaction between levels of hierarchy.

Current clock distributions construction methods can require large design resources including for example, wires, and gates in clock grids or extensive tuning for different random logic macro (RLM) tree latencies such as in standard buffer trees.

Known arrangements include clock grids or meshes that can achieve very low skew, but are rigid in their planning and layout, and costly in wiring and design resources required. Buffer or inverter trees offer flexibility, but are limited in their skew control, and need extensive tuning to balance out differences between small and large hierarchical blocks. Trees that use large buffers and wide or thick wires, such as structured clock buffers (SCB) trees, enable good performance, but often thick metal is not available inside child hierarchical blocks or only available at the parent or chip level.

In an application specific integrated circuit (ASIC) design, a common design methodology takes advantage of the use of random logic macros (RLMs) to improve data management and design closure. RLMs increase complexity for clocking by decreasing the chances of finding optimal solutions due to placement, routing and timing issues.

A need exists for an efficient and effective mechanism to implement enhanced clock tree distributions to decouple across N-level hierarchical entities of an integrated circuit chip.

SUMMARY OF THE INVENTION

A principal aspect of the present invention is to provide a method, system and computer program product for implementing enhanced clock tree distributions to decouple across N-level hierarchical entities of an integrated circuit chip. Other important aspects of the present invention are to provide such method, system, and computer program product substantially without negative effects and that overcome many of the disadvantages of prior art arrangements.

In brief, a method, system and computer program product for implementing enhanced clock tree distributions to decouple across N-level hierarchical entities of an integrated circuit chip. Local clock tree distributions are constructed. Top clock tree distributions are constructed. Then constructing and routing a top clock tree is provided.

In accordance with features of the invention, the local clock tree distributions and the top clock tree distributions are independently constructed, each using an equivalent local clock distribution of high performance buffers to balance the clock block regions.

In accordance with features of the invention, the construction of the local clock tree distributions and the top clock tree distributions include initially determining and setting a plurality of local clock block areas. Then placing and fixing starting buffer of clock block area serial trees is provided, together with fixing blockage overlaps and cloning serial trees is provided if required.

In accordance with features of the invention, the hybrid top or global tree is constructed with a structured clock buffer floor planner (SCBFP) tree builder with large clock buffers placed and fixed. Then routing of the hybrid top or global tree is performed.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method, a system, and a computer program product are provided for implementing enhanced clock tree distributions across N-level hierarchical entities of an integrated circuit chip.

In accordance with features of the invention, the local clock tree distribution and the top clock tree distribution are independently constructed, each local clock tree uses an equivalent clock distribution of high performance buffers to balance the clock block regions. Clocking and timing are decoupled. The present invention enables timing closure and clock to be done independently and in parallel. The need for clock delay books is eliminated, which typically adds timing complexity and possibly timing variability into the design with some conventional clocking systems.

In accordance with features of the invention, the present two level tree process eliminates the need for random logic macro (RLM) basining or early clock. Balancing requirement for different RLM clock tree sizes and latencies is eliminated. Latency of the clock tree contained in the random logic macro (RLM) or local tree is reduced. The use of more top metal layers for the majority of the RLM tree distribution is enabled. A highly consistent and uniform routing problem is provided to top for the balanced router. The high fan out typical of structured clock buffers (SCB) balanced routing in a full SCB tree is eliminated.

Figure 1:
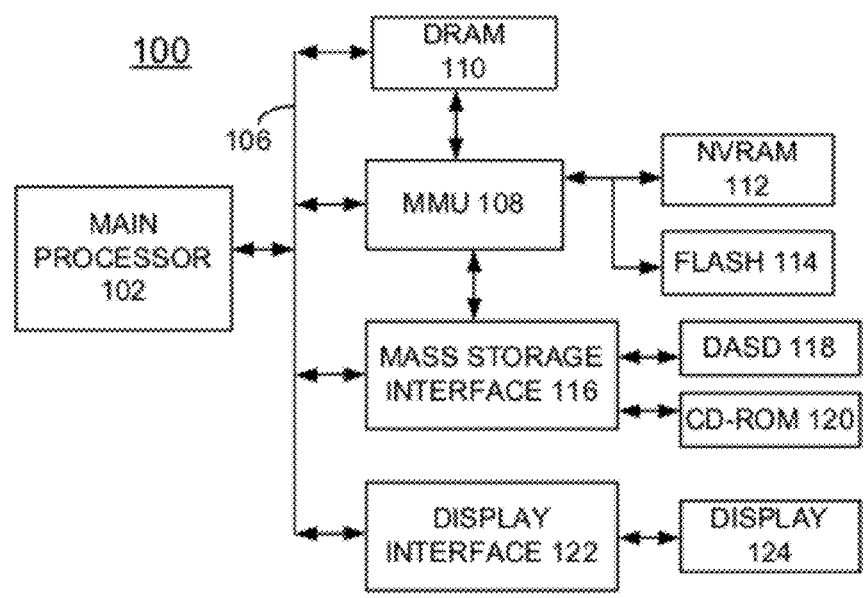
FIGS. 1 and 2 are block diagram representations illustrating an example computer system and operating system for implementing enhanced clock tree distributions to decouple across N-level hierarchical entities of an integrated circuit chip in accordance with the preferred embodiment.
Figure 2:
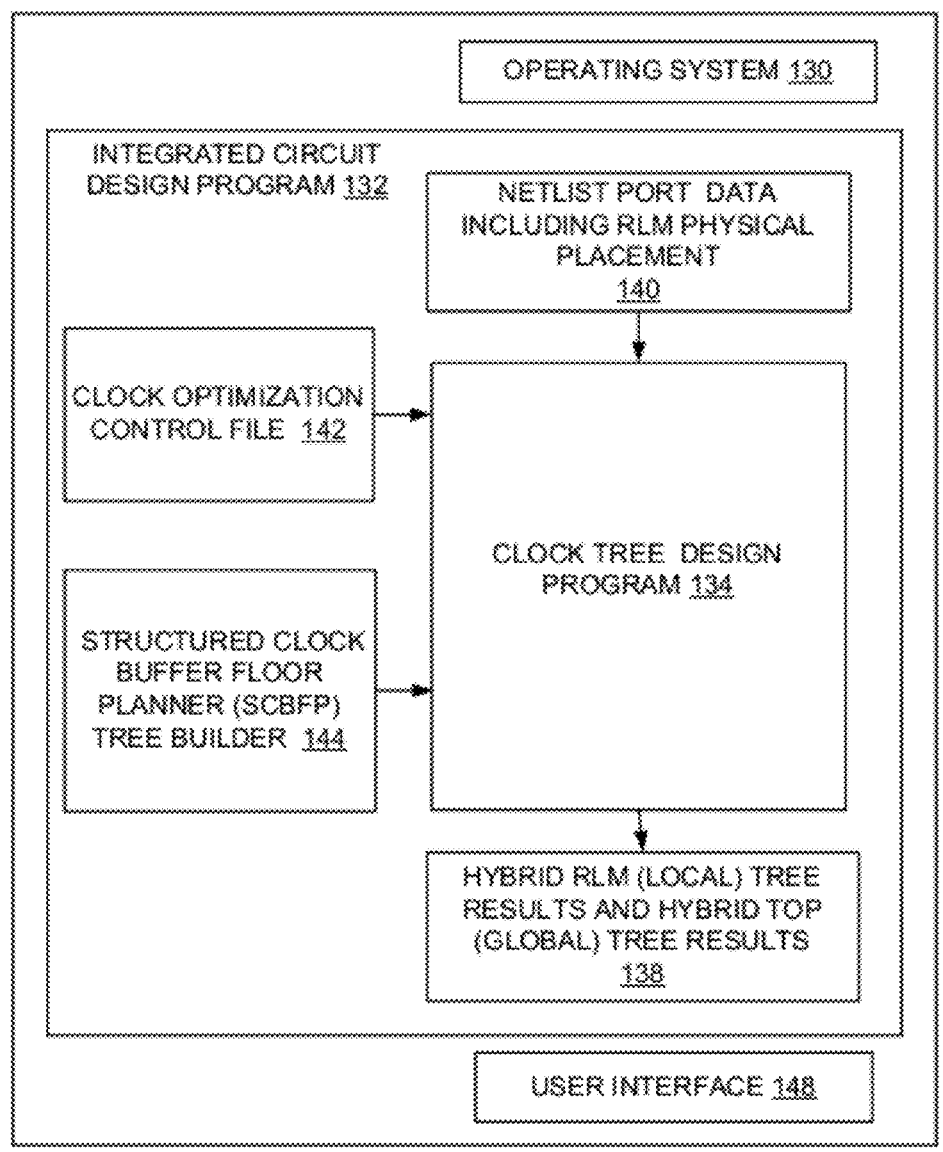

Referring now to the drawings, in FIGS. 1 and 2 there is shown a computer system generally designated by the reference character 100 for implementing enhanced clock tree distributions to decouple across N-level hierarchical entities of an integrated circuit chip in accordance with the preferred embodiment. Computer system 100 includes a main processor 102 or central processor unit (CPU) 102 coupled by a system bus 106 to a memory management unit (MMU) 108 and system memory including a dynamic random access memory (DRAM) 110, a nonvolatile random access memory (NVRAM) 112, and a flash memory 114. A mass storage interface 116 coupled to the system bus 106 and MMU 108 connects a direct access storage device (DASD) 118 and a CD-ROM drive 120 to the main processor 102. Computer system 100 includes a display interface 122 coupled to the system bus 106 and connected to a display 124.

Computer system 100 is shown in simplified form sufficient for understanding the present invention. The illustrated computer system 100 is not intended to imply architectural or functional limitations. The present invention can be used with various hardware implementations and systems and various other internal hardware devices, for example, multiple main processors.

As shown in FIG. 2, computer system 100 includes an operating system 130, an integrated circuit design program 132, a clock tree design 134 of the preferred embodiment, providing hybrid random logic macro (RLM) or local tree results and hybrid top or global tree results 138, netlist data including random logic macro (RLM) physical placement 140, clock optimization control file 142, structured clock buffer floor planner (SCBFP) 144, and a user interface 148.

Various commercially available computers can be used for computer system 100. CPU 102 is suitably programmed by the clock tree design 134 to execute the flowchart of FIG. 3 for implementing enhanced clock tree distributions to decouple across N-level hierarchical entities of an integrated circuit chip in accordance with the preferred embodiment.

Figure 3:
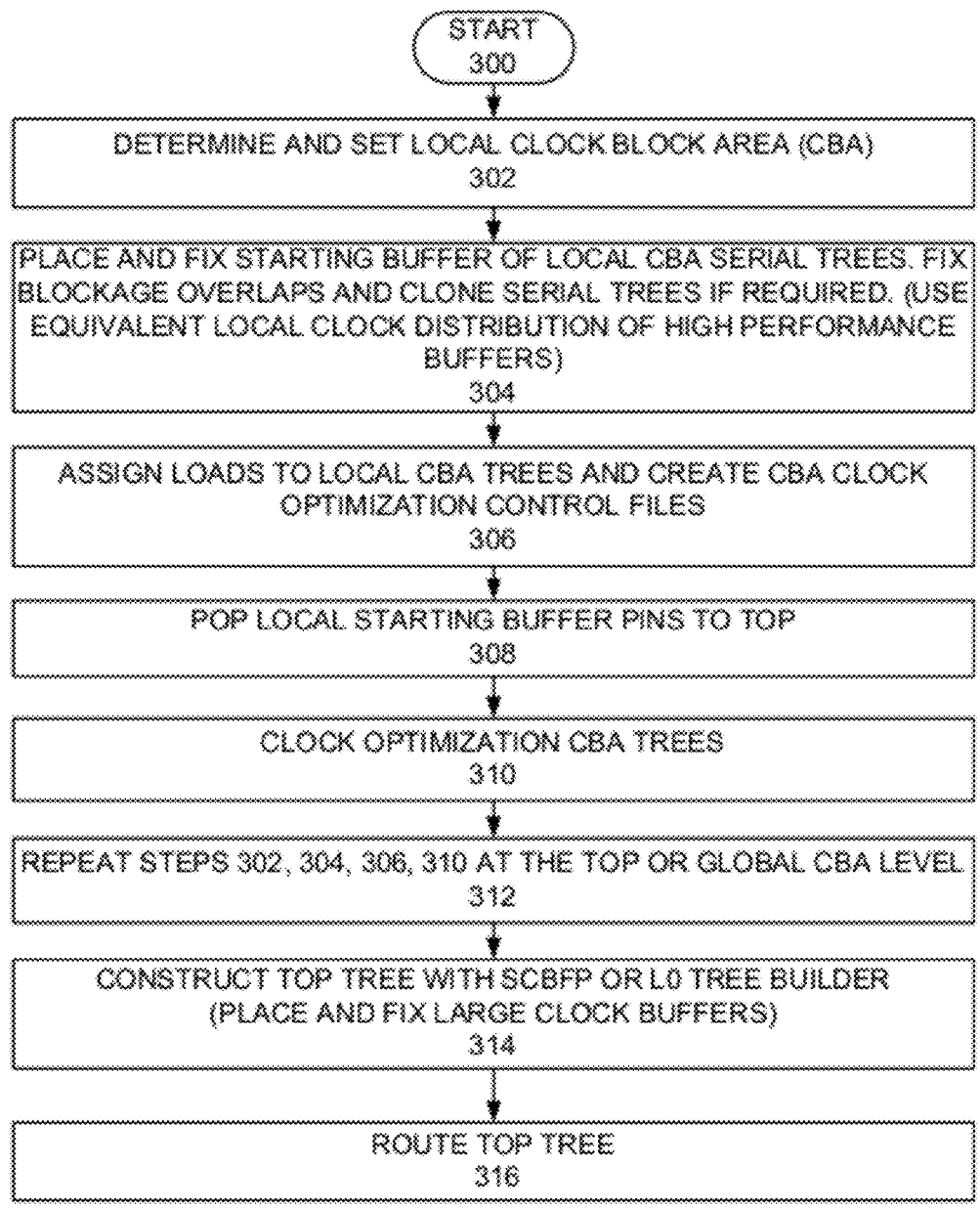
FIG. 3 is a flow chart illustrating exemplary sequential steps for implementing enhanced clock tree distributions to decouple across N-level hierarchical entities of an integrated circuit chip in accordance with the preferred embodiment.

Referring to FIG. 3, there are shown exemplary sequential steps starting at a block 300 for implementing enhanced clock tree distributions to decouple across N-level hierarchical entities of an integrated circuit chip in accordance with the preferred embodiment. As indicated at a block 302, initially each local clock block area (CBA) is determined and set. A starting buffer of local CBA serial trees are placed and fixed as indicated at a block 304. If required, blockage overlaps are fixed and serial trees are cloned at block 304. At block 304, an equivalent local clock distribution of high performance buffers is used to balance the clock block areas.

As indicated at a block 306, loads are assigned to local CBA trees and CBA clock optimization control files are created. Next local starting buffer pins are pop to the top of the local CBA serial buffer trees as indicated at a block 308. Then clock optimization of the CBA trees is performed as indicated at a block 310. Next for the top or global level, the steps indicated at block 302, 304, 306, and 310 are repeated as indicated at a block 312.

A hybrid top or global tree is constructed with the structured clock buffer floor planner (SCBFP) tree builder or other available tree builder, such as an L0 tree builder with large clock buffers placed and fixed, as indicated at a block 314. Then routing of the hybrid top or global tree is performed as indicated at a block 316.

Figure 4:
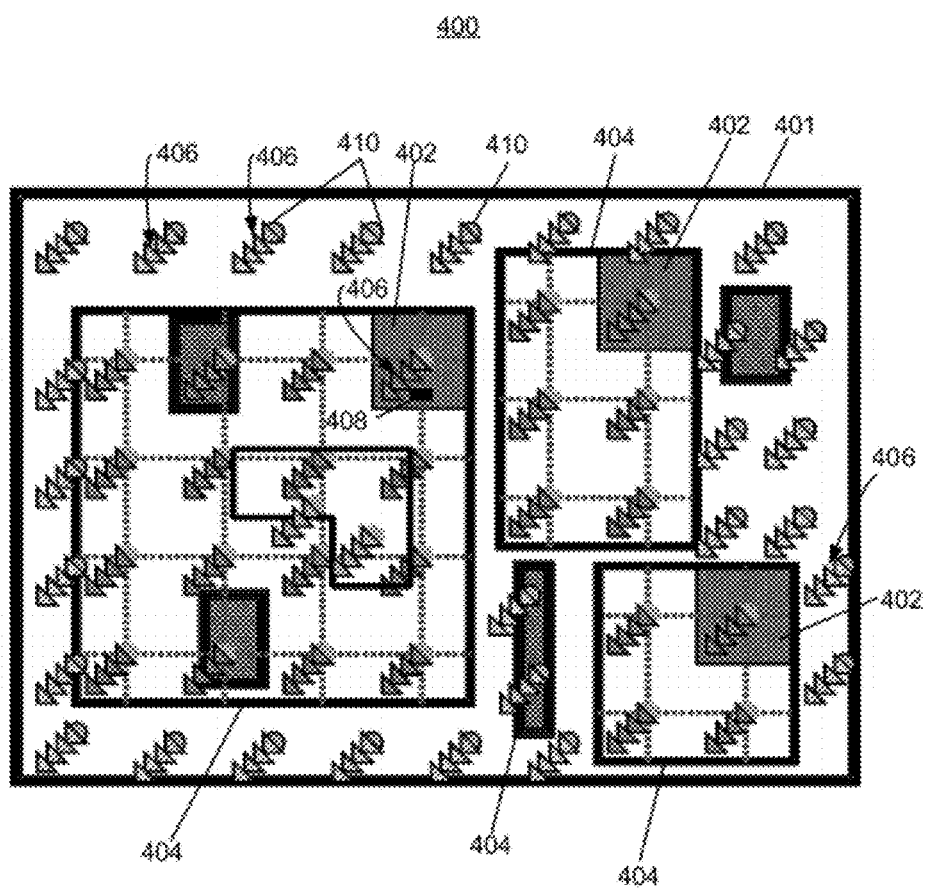
FIGS. 4 and 5 illustrate an example clock tree process for enhanced clock tree distributions to decouple across N-level hierarchical entities of an integrated circuit chip in accordance with the preferred embodiment.
Figure 5:
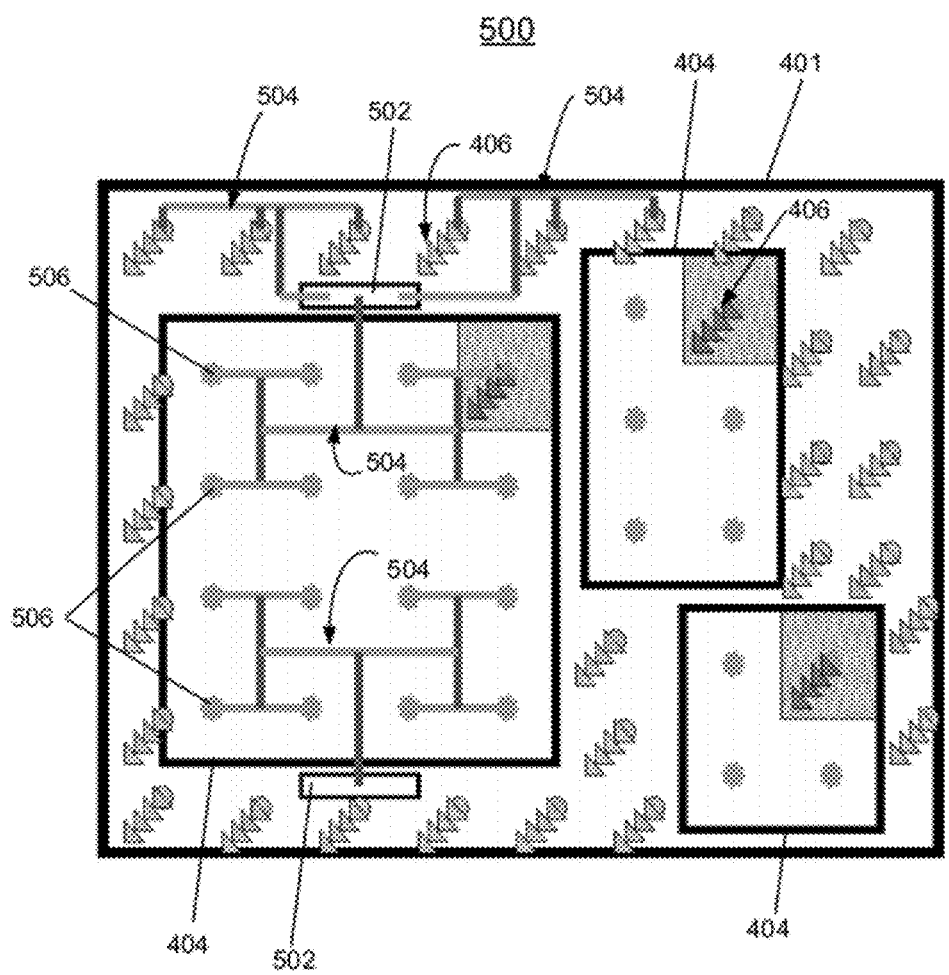

FIGS. 4 and 5 illustrate features of an example clock tree process for enhanced clock tree distributions to decouple across N-level hierarchical entities of an integrated circuit chip in accordance with the preferred embodiment.

Referring to FIG. 4, there are shown exemplary clock tree process steps generally designated by the reference character 400 in the enhanced clock tree distributions design of an integrated circuit chip 401. As shown, the enhanced clock tree distributions design includes a local clock block area (CBA) 402, which is determined and set at block 302 in FIG. 3, for example, included in a random logic macro (RLM) 404. The starting buffer of a local CBA serial buffer tree 406, which are placed and fixed at block 304 of FIG. 3, with loads assigned at block 306 of FIG. 3, such as an illustrated load 408. Local starting buffer pins 410 are shown at the top of the CBA serial buffer trees, which are placed at block 308 of FIG. 3.

Referring to FIG. 5, there are shown further exemplary clock tree process steps generally designated by the reference character 500 in the enhanced clock tree distributions design of an integrated circuit chip 401.

In FIG. 5, the enhanced clock tree distributions design includes, as shown an example pair of large clock buffers 502, which are placed and fixed at block 314 of FIG. 3. An example hybrid top or global tree 504 is shown, such as constructed with the structured clock buffer floor planner (SCBFP) tree builder at block 314 of FIG. 3. Hybrid tree timing includes at all RLM clock ports 506, a latency and slew value being provided for timing from the hybrid top or global tree 504. A latency, variation, and slew value of the local clock tree 406 is provided from timing the local clock tree 406.

Figure 6:
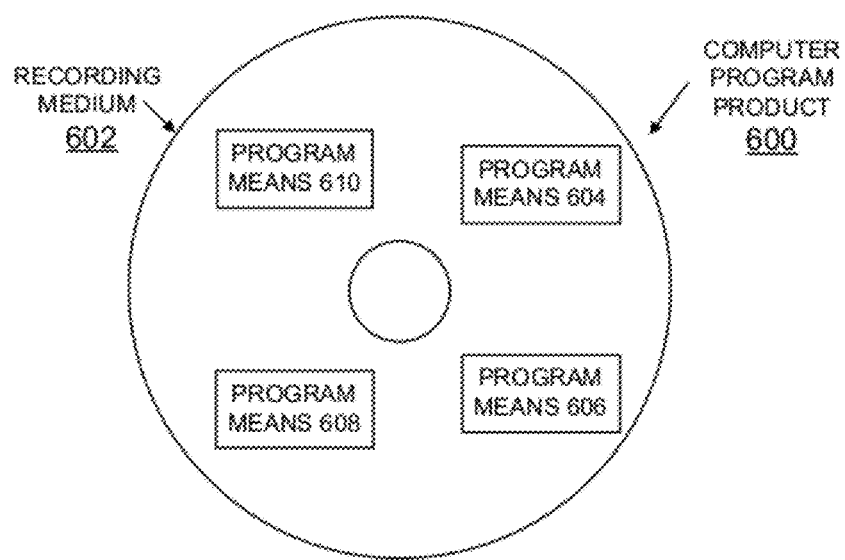
FIG. 6 is a block diagram illustrating a computer program product in accordance with the preferred embodiment.

Referring now to FIG. 6, an article of manufacture or a computer program product 600 of the invention is illustrated. The computer program product 600 includes a recording medium 602, such as, a floppy disk, a high capacity read only memory in the form of an optically read compact disk or CD-ROM, a tape, or another similar computer program product. Recording medium 602 stores program means 604, 606, 608, 610 on the medium 602 for carrying out the methods for implementing enhanced clock tree distributions to decouple across N-level hierarchical entities of an integrated circuit chip of the preferred embodiment in the system 100 of FIG. 1.

A sequence of program instructions or a logical assembly of one or more interrelated modules defined by the recorded program means 604, 606, 608, 610, direct the computer system 100 for implementing enhanced clock tree distributions to decouple across N-level hierarchical entities of an integrated circuit chip of the preferred embodiment.

While the present invention has been described with reference to the details of the embodiments of the invention shown in the drawing, these details are not intended to limit the scope of the invention as claimed in the appended claims.

What is claimed is:

1. A computer-implemented method for implementing decoupled clock tree distributions on a hierarchical design of an integrated circuit chip comprising:

using a computer, constructing local clock tree distributions using an equivalent clock distribution of high performance buffers to balance the clock block areas and including to metal layers for said local clock tree distributions;

using a computer, constructing top clock tree distributions using an equivalent clock distribution of high performance buffers to balance the clock block areas of said top clock tree distributions; said local clock tree distributions and said to clock tree distributions being independently constructed, enabling timing closure and clock optimization to be done independently and in parallel and eliminating use of clock delay books; and using a computer, constructing and routing a top clock tree.

2. The computer-implemented method as recited in claim 1 wherein constructing local clock tree distributions and constructing top clock tree distributions include initially determining and setting a plurality of local clock block areas.

3. The computer-implemented method as recited in claim 2 include placing and fixing starting buffer of respective clock block area serial trees.

4. The computer-implemented method as recited in claim 3 include fixing blockage overlaps and cloning serial trees.

5. The computer-implemented method as recited in claim 3 include assigning loads to respective clock block area serial trees and creating respective clock block area optimization control files.

6. The computer-implemented method as recited in claim 2 wherein constructing local clock tree distributions and constructing top clock tree distributions include performing clock optimization of constructed clock block area trees.

7. The computer-implemented method as recited in claim 1 wherein constructing and routing a top clock tree include using a structured clock buffer floor planner (SCBFP) tree builder with large clock buffers placed and fixed.

8. An integrated circuit design computer program product for implementing decoupled clock tree distributions on a hierarchical design of an integrated circuit chip in a computer system, said computer program product tangibly embodied in a non-transitory machine readable medium used in the integrated circuit design process, said integrated circuit design computer program product including a clock tree design program, said integrated circuit design computer program product including instructions executed by the computer system to cause the computer system to perform the steps of:

constructing local clock tree distributions using an equivalent clock distribution of high performance buffers to balance the clock block areas and including to metal layers for said local clock tree distributions;

constructing top clock tree distributions using an equivalent clock distribution of high performance buffers to balance the clock block areas of said to clock tree distributions; said local clock tree distributions and said to clock tree distributions being independently constructed, enabling timing closure and clock optimization to be done independently and in parallel and eliminating use of clock delay books; and constructing and routing a top clock tree.

9. The integrated circuit design computer program product as recited in claim 8 wherein constructing local clock tree distributions and constructing top clock tree distributions include initially determining and setting a plurality of local clock block areas.

10. The integrated circuit design computer program product as recited in claim 9 said steps include placing and fixing starting buffer of respective clock block area serial trees.

11. The integrated circuit design computer program product as recited in claim 10 said steps include fixing blockage overlaps and cloning serial trees.

12. The integrated circuit design computer program product as recited in claim 10 said steps include assigning loads to respective clock block area serial trees and creating respective clock block area optimization control files.

13. The integrated circuit design computer program product as recited in claim 9 wherein constructing local clock tree distributions and constructing top clock tree distributions include performing clock optimization of constructed clock block area trees.

14. The integrated circuit design computer program product as recited in claim 8 wherein constructing and routing a top clock tree include using a structured clock buffer floor planner (SCBFP) tree builder with large clock buffers placed and fixed.

15. A system for implementing enhanced decoupled clock tree distributions on a hierarchical design of an integrated circuit chip comprising:

a processor, an integrated circuit design program tangibly embodied in a non-transitory machine readable medium used in the integrated circuit design process, said integrated circuit design program including a clock tree design program, and said processor using said a clock tree design program, constructing local clock tree distributions using an equivalent clock distribution of high performance buffers to balance the clock block areas and including to metal layers for said local clock tree distributions;

said processor using said a clock tree design program, constructing top clock tree distributions using an equivalent clock distribution of high performance buffers to balance the clock block areas of said to clock tree distributions; said local clock tree distributions and said to clock tree distributions being independently constructed, enabling timing closure and clock optimization to be done independently and in parallel and eliminating use of clock delay books; and constructing and routing a top clock tree.

16. The system as recited in claim 15 wherein said processor using said clock tree design program, constructing local clock tree distributions and constructing top clock tree distributions include said processor initially determining and setting a plurality of local clock block areas.

17. The system as recited in claim 16 include said processor placing and fixing starting buffer of respective clock block area serial trees.

18. The system as recited in claim 17 include said processor assigning loads to respective clock block area serial trees and creating respective clock block area optimization control files.

19. The system as recited in claim 16 include said processor performing clock optimization of constructed clock block area trees.

20. The system as recited in claim 15 wherein said processor constructing and routing a top clock tree include said processor using a structured clock buffer floor planner (SCBFP) tree builder with large clock buffers placed and fixed.

* * * * *

UNITED STATES PATENT AND TRADEMARK OFFICE
CERTIFICATE OF CORRECTION

PATENT NO. : 8,356,264 B2
APPLICATION NO. : 12/914573
DATED : January 15, 2013
INVENTOR(S) : Mark R. Lasher et al.

Page 1 of 1

It is certified that error appears in the above-identified patent and that said Letters Patent is hereby corrected as shown below:

In the Claims:

Column 4, line 66 change "including to metal layers" to
--including top metal layers--
Column 5, line 5 change "and said to clock tree distributions" to
--said top clock tree distributions--

Column 5, lines 44-45 change "including to metal layers" to
--including top metal layers--
Column 5, lines 48-49 change "areas of said to clock tree distributions" to
--areas of said top clock tree distributions--
Column 5, line 49-50 change "and said to clock tree distributions" to
--and said top clock tree distributions--

Column 6, line 30-31 change "including to metal layers" to
--including top metal layers--
Column 6, lines 34-35 change "areas of said to clock tree distributions" to
--areas of said top clock tree distributions--
Column 6, line 35-36 change "and said to clock tree distributions" to
--and said top clock tree distributions--

Signed and Sealed this
Fourteenth Day of May, 2013

Teresa Stanek Rea
*Acting Director of the United States Patent and Trademark Office*